US012787768B2

(12) United States Patent
Park et al.

(10) Patent No.: US 12,787,768 B2
(45) Date of Patent: Nov. 3, 2026

(54) SEMICONDUCTOR PACKAGING HAVING THERMAL INTERFACIAL MATERIAL FILM INCLUDING EPOXY AND LIQUID METAL FILLER

(71) Applicant: SAMSUNG ELECTRONICS CO., LTD., Suwon-si (KR)

(72) Inventors: Mihyae Park, Suwon-si (KR); Chiwoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 749 days.

(21) Appl. No.: 18/118,983

(22) Filed: Mar. 8, 2023

(65) Prior Publication Data

US 2024/0063085 A1 Feb. 22, 2024

(30) Foreign Application Priority Data

Aug. 19, 2022 (KR) ........................ 10-2022-0104330

(51) Int. Cl.

*H10W 40/25* (2026.01)
*H10B 80/00* (2026.01)

(Continued)

(52) U.S. Cl.

CPC .......... *H10W 40/251* (2026.01); *H10B 80/00* (2023.02); *H10W 70/611* (2026.01); *H10W 72/07354* (2026.01); *H10W 74/117* (2026.01); *H10W 90/401* (2026.01); *H10W 72/07338* (2026.01); *H10W 72/347* (2026.01); *H10W 72/877* (2026.01); *H10W 74/15* (2026.01); *H10W 90/724* (2026.01); *H10W 90/734* (2026.01); *H10W 90/736* (2026.01)

(58) Field of Classification Search

CPC ............. H01L 23/3737; H01L 23/3128; H01L 23/5385; H01L 24/32; H01L 24/83; H10B 80/00; H10W 40/251; H10W 90/401; H10W 74/117; H10W 70/611

See application file for complete search history.

(56) References Cited

U.S. PATENT DOCUMENTS

| | | | |
|---|---|---|---|
| 6,630,371 | B2 | 10/2003 | Hembree |
| 7,446,407 | B2 | 11/2008 | Lin et al. |

(Continued)

FOREIGN PATENT DOCUMENTS

| | | |
|---|---|---|
| KR | 10-1829392 B1 | 2/2018 |
| KR | 10-2019-0091752 A | 8/2019 |

(Continued)

OTHER PUBLICATIONS

Office Action dated Apr. 23, 2026, issued by Korean Patent Office in Korean Patent Application No. 10-2022-0104330.

*Primary Examiner* — Michael Jung
(74) *Attorney, Agent, or Firm* — Sughrue Mion, PLLC

(57) ABSTRACT

A semiconductor package including a first semiconductor chip and a second semiconductor chip on a first substrate, a thermal conductive adhesive layer on the first semiconductor chip and the second semiconductor chip and including a resin layer, the resin layer including a first heat dissipation filler, the first heat dissipation filler including a liquid metal, and the semiconductor package further including a heat dissipation member on the thermal conductive adhesive layer.

13 Claims, 9 Drawing Sheets

(51) Int. Cl.

| | |
|---|---|
| ***H10W 70/60*** | (2026.01) |
| ***H10W 74/10*** | (2026.01) |
| ***H10W 90/00*** | (2026.01) |
| *H10W 72/00* | (2026.01) |
| *H10W 72/30* | (2026.01) |
| *H10W 74/15* | (2026.01) |

(56) References Cited

U.S. PATENT DOCUMENTS

| | | | | |
|---|---|---|---|---|
| 8,415,204 | B2 | 4/2013 | Yun et al. | |
| 8,748,228 | B2 | 6/2014 | Kim et al. | |
| 9,460,983 | B2 | 10/2016 | Horiuchi et al. | |
| 11,335,622 | B2 | 5/2022 | Kazem et al. | |
| 2007/0001292 | A1 | 1/2007 | Ohta et al. | |
| 2011/0038124 | A1 | 2/2011 | Burnham et al. | |
| 2014/0252634 | A1* | 9/2014 | Hung | H01L 25/50 257/773 |
| 2019/0309206 | A1* | 10/2019 | Tsuji | C08G 77/12 |
| 2020/0020606 | A1* | 1/2020 | Kim | H01L 23/367 |
| 2021/0206906 | A1 | 7/2021 | Kiguchi et al. | |
| 2024/0006393 | A1* | 1/2024 | Kweon | H01L 23/3736 |

FOREIGN PATENT DOCUMENTS

| | | | |
|---|---|---|---|
| KR | 10-2020-0006734 | A | 1/2020 |
| KR | 10-2022-0086284 | A | 6/2022 |

* cited by examiner

SEMICONDUCTOR PACKAGING HAVING THERMAL INTERFACIAL MATERIAL FILM INCLUDING EPOXY AND LIQUID METAL FILLER

CROSS-REFERENCE TO RELATED APPLICATION

This application is based on and claims priority to Korean Patent Application No. 10-2022-0104330, filed on Aug. 19, 2022, in the Korean Intellectual Property Office, the disclosure of which is incorporated by reference herein in its entirety.

BACKGROUND

The present disclosure relates to a thermal interfacial material (TIM) film, a semiconductor package manufactured with the TIM film and a method of manufacturing the semiconductor package.

Various semiconductor chips may be packaged in one semiconductor package, and the various semiconductor chips may be electrically connected to each other to operate as one system. However, in such semiconductor packages, there may be a problem in that excessive heat may be generated when the various semiconductor chips operate, and the performance of the semiconductor package may be reduced due to the excessive heat.

SUMMARY

The disclosure provides a thermal interfacial material (TIM) film having improved thermal conductivity properties, a semiconductor package having improved heat dissipation characteristics manufactured with the TIM film and a method of manufacturing the semiconductor package.

According to an aspect of an example embodiment, a semiconductor package includes: a first semiconductor chip and a second semiconductor chip on a first substrate; a thermal conductive adhesive layer on the first semiconductor chip and the second semiconductor chip and comprising a resin layer, the resin layer comprising a first heat dissipation filler, and the first heat dissipation filler comprising a liquid metal; and a heat dissipation member on the thermal conductive adhesive layer.

According to an aspect of an example embodiment, a semiconductor package includes: a package substrate; an interposer substrate on the package substrate; a first semiconductor chip on the interposer substrate; a second semiconductor chip on the interposer substrate and laterally spaced apart from the first semiconductor chip; a thermal conductive adhesive layer on the first semiconductor chip and the second semiconductor chip and comprising a resin layer, the resin layer comprising a first heat dissipation filler, and the first heat dissipation filler comprising a liquid metal; and a heat dissipation member on the thermal conductive adhesive layer, wherein an upper surface of the first semiconductor chip is at a different level than an upper surface of the second semiconductor chip, wherein the thermal conductive adhesive layer extends along the upper surface of the first semiconductor chip and the upper surface of the second semiconductor chip, wherein the thermal conductive adhesive layer extends from each of the upper surface of the first semiconductor chip and the upper surface of the second semiconductor chip to the heat dissipation member, wherein a thermal conductivity of the thermal conductive adhesive layer is in a range of about 2 W/mK to about 100 W/mK, and wherein an elongation of the thermal conductive adhesive layer is in a range of about 5% to about 200%.

According to an aspect of an example embodiment, a thermal interfacial material (TIM) film includes: a resin layer; wherein the resin layer comprises a resin in a semi-cured state and a first heat dissipation filler, and wherein the first heat dissipation filler comprises a liquid metal.

According to an aspect of an example embodiment, a method of manufacturing a semiconductor package includes: mounting at least one semiconductor chip on a first substrate; attaching a thermal interface material (TIM) film to a heat dissipation member, the thermal interfacial material (TIM) film comprising a resin layer comprising a semi-cured resin and a first heat dissipation filler, and wherein the first heat dissipation filler comprises a liquid metal; providing the heat dissipation member on the at least one semiconductor chip to cause the thermal interfacial material (TIM) film to contact the at least one semiconductor chip; and curing the resin layer of the thermal interfacial material (TIM) film to form a thermal conductive adhesive layer that fills a gap between the at least one semiconductor chip and the heat dissipation member.

BRIEF DESCRIPTION OF DRAWINGS

The above and other aspects and features will be more apparent from the following description of example embodiments, taken in conjunction with the accompanying drawings, in which.

DETAILED DESCRIPTION OF EMBODIMENTS

Figure 1:
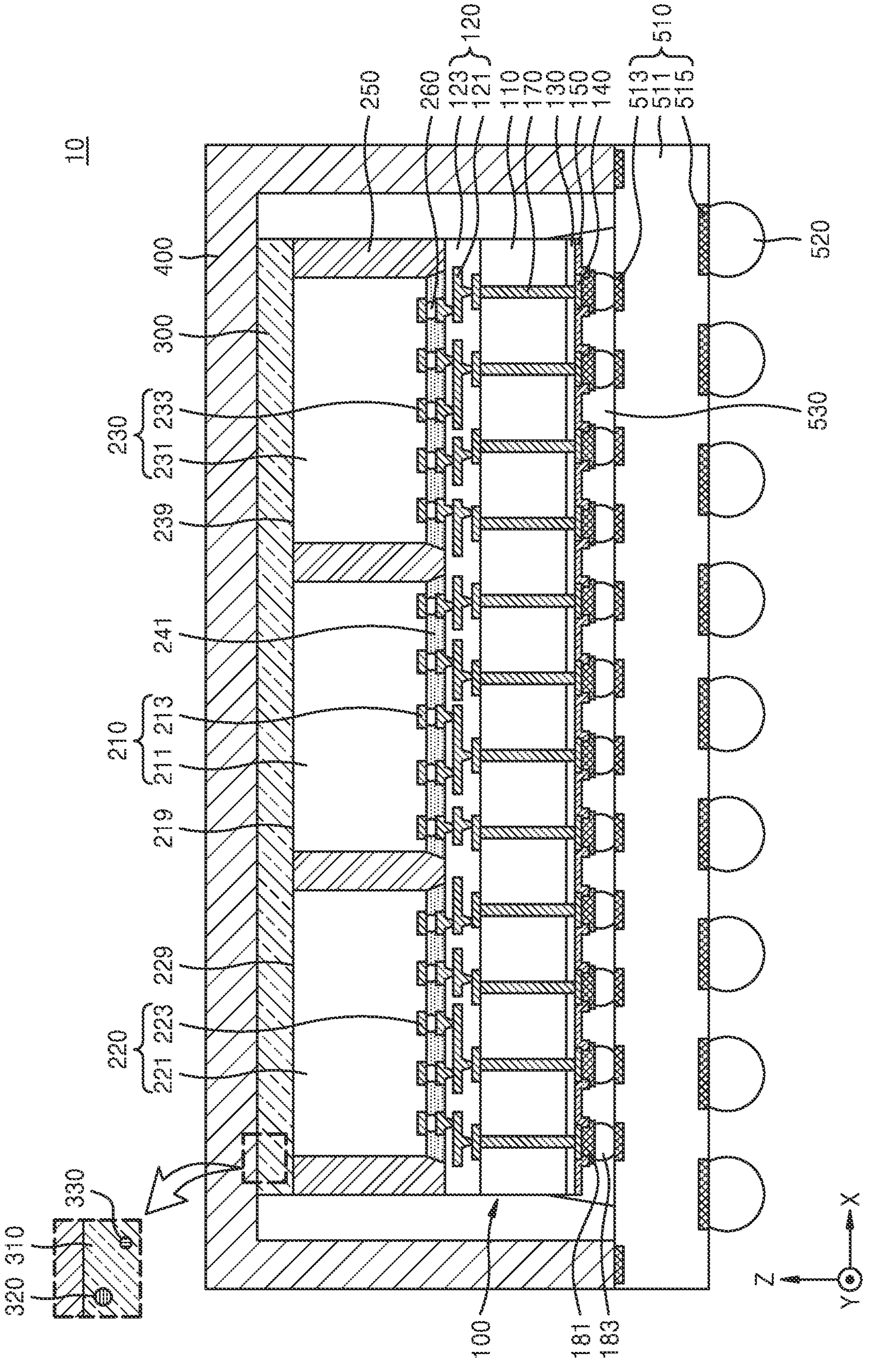
FIG. 1 is a cross-sectional view illustrating a semiconductor package according to an example embodiment.

Example embodiments will be described more fully with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, “at least one of a, b, and c,” should be understood as including only a, only b, only c, both a and b, both a and c, both b and c, or all of a, b, and c. The same reference numerals are used for the same components in the drawings, and redundant descriptions thereof are omitted.

FIG. 1 is a cross-sectional view illustrating a semiconductor package 10 according to an example embodiment.

Referring to FIG. 1, the semiconductor package 10 may include a package substrate 510, an interposer substrate 100, first to third semiconductor chips 210, 220, and 230, a molding layer 250, a heat dissipation member 400, and a thermal conductive adhesive layer 300.

The interposer substrate 100 may include a base layer 110, a redistribution structure 120, a first lower protective layer 130, lower conductive pads 140, a second lower protective layer 150, and via electrodes 170. The interposer substrate 100 may also be referred to as a first substrate.

The base layer 110 may include a semiconductor material, glass, ceramic, or plastic. In example embodiments, the base layer 110 may include a silicon wafer including silicon (Si), such as, crystalline silicon, polycrystalline silicon, or amorphous silicon. The base layer 110 may generally have a flat plate shape and may include upper and lower surfaces opposite to each other.

The redistribution structure 120 may be on the upper surface of the base layer 110. The redistribution structure 120 may include an insulating layer 123 covering the upper surface of the base layer 110 and conductive redistribution patterns 121 covered by the insulating layer 123. For example, the redistribution structure 120 may include a back-end-of-line (BEOL) structure.

In example embodiments, the insulating layer 123 may include an inorganic insulating material. For example, the insulating layer 123 may include at least one of an oxide and a nitride. For example, the insulating layer 123 may include at least one of a silicon oxide and a silicon nitride. In other example embodiments, the insulating layer 123 may include an organic insulating material. For example, the insulating layer 123 may include a photo imageable dielectric (PID), such as polyimide.

The conductive redistribution patterns 121 may each include a plurality of conductive layers at different levels in the insulating layer 123 to form a multi-layer structure, and conductive vias extending in a vertical direction (for example, the Z direction) in the insulating layer 123. For example, the conductive redistribution patterns 121 may each include at least one metal selected from tungsten (W), aluminum (Al), and copper (Cu).

Some of the conductive redistribution patterns 121 may be on an upper surface of the insulating layer 123 and may function as a pad to which each of connection bumps 260 that electrically and physically connect the first to third semiconductor chips 210, 220, and 230 to the interposer substrate 100 is attached.

The first lower protective layer 130 may cover the lower surface of the base layer 110. In addition, the first lower protective layer 130 may cover sidewalls of the via electrodes 170 protruding from the lower surface of the base layer 110. In example embodiments, a lower surface of the first lower protective layer 130 may be coplanar with lower surfaces of the via electrodes 170 respectively in contact with the lower conductive pads 140.

In example embodiments, the first lower protective layer 130 may include an inorganic insulating material. For example, the first lower protective layer 130 may include at least one of an oxide and a nitride. For example, the first lower protective layer 130 may include at least one of a silicon oxide and a silicon nitride.

The lower conductive pads 140 may be on the lower surface of the first lower protective layer 130. For example, the lower conductive pads 140 may be respectively connected to board-interposer connection bumps 183. The lower conductive pads 140 may be spaced apart from each other in the horizontal direction (for example, the X direction or the Y direction) on the lower surface of the first lower protective layer 130. For example, the lower conductive pads 140 may be arranged in a two-dimensional array on the lower surface of the first lower protective layer 130. The lower conductive pads 140 may each have a polygonal shape in a plan view, for example, a rectangular shape or a hexagonal shape in a plan view. Alternatively, the lower conductive pads 140 may each have a circular shape or an elliptical shape in a plan view. The lower conductive pads 140 may each include at least one metal selected from among, for example, tungsten (W), aluminum (Al), and copper (Cu).

In example embodiments, the lower conductive pads 140 may each have a uniform thickness. When the lower conductive pads 140 each have an upper surface in contact with the first lower protective layer 130 and the via electrode 170 and a lower surface opposite to the upper surface, the upper surface and the lower surface of each of the lower conductive pads 140 may be flat.

The second lower protective layer 150 may cover a lower surface of the first lower protective layer 130 and may cover a part of each of the lower conductive pads 140. The second lower protective layer 150 may include openings exposing a part of a lower surface of each of the lower conductive pads 140. The board-interposer connection bumps 183 may be respectively connected to the lower conductive pads 140 through the openings of the second lower protective layer 150.

In example embodiments, the second lower protective layer 150 may be formed of a material different from a material of the first lower protective layer 130. The first lower protective layer 130 may be formed of an inorganic insulating material, and the second lower protective layer 150 may be formed of an organic insulating material. In example embodiments, the second lower protective layer 150 may include a PID. For example, the second lower protective layer 150 may include polyimide (PI) or polybenzoxazole (PBO). In other example embodiments, the second lower protective layer 150 may also be formed of an inorganic insulating material.

The interposer substrate 100 may include lower connection pillars 181 respectively on the lower conductive pads 140. The lower connection pillars 181 may be respectively connected to the lower conductive pads 140 through the openings of the second lower protective layer 150 and may be in contact with a part of the second lower protective layer 150 covering edges of the lower surfaces of the lower conductive pads 140. The lower connection pillars 181 may each function as under bump metallurgy. The lower connection pillars 181 may each include nickel (Ni), copper (Cu), palladium (Pd), platinum (Pt), gold (Au), or a combination thereof. In some example embodiments, the lower connection pillars 181 may be omitted. The board-interposer connection bumps 183 may be respectively attached to the lower connection pillars 181. The board-interposer connection bumps 183 may each connect electrically and physically between the interposer substrate 100 and the package substrate 510. The board-interposer connection bumps 183 may have widths that are greater than widths of the connection bumps 260.

The via electrodes 170 may electrically connect the conductive redistribution patterns 121 of the redistribution structure 120 to the lower conductive pads 140. The via electrodes 170 may extend from the upper surface of the base layer 110 to the lower surface thereof and vertically penetrate through the base layer 110. In addition, the via electrodes 170 may further penetrate the first lower protective layer 130 on the lower surface of the base layer 110 so as to contact the lower conductive pads 140. Upper ends of the via electrodes 170 may be respectively connected to the conductive redistribution patterns 121 of the redistribution structure 120, and lower ends of the via electrodes 170 may be respectively connected to the lower conductive pads 140.

For example, the via electrodes 170 may each include a column-shaped conductive plug that penetrates the base layer 110 and the first lower protective layer 130, and a cylindrical conductive barrier layer surrounding a sidewall of the conductive plug. The conductive barrier layer may include at least one material selected from Ti, TiN, Ta, TaN, Ru, Co, Mn, WN, Ni, and NiB, and the conductive plug may include at least one material selected from a Cu alloy, such as Cu, CuSn, CuMg, CuNi, CuZn, CuPd, CuAu, CuRe, and CuW, W, a W alloy, Ni, Ru, and Co. A via insulating layer may be between the base layer 110 and the via electrode 170. The via insulating layer may be formed from an oxide layer, a nitride layer, a carbide layer, a polymer, or a combination thereof.

The first to third semiconductor chips 210, 220, and 230 may be mounted on the interposer substrate 100 and arranged laterally on the interposer substrate 100. The first to third semiconductor chips 210, 220, and 230 may be electrically connected to each other through an electrical connection path provided by the interposer substrate 100. Although the example embodiment of FIG. 1 illustrates that three semiconductor chips spaced apart from each other in a lateral direction are mounted on the interposer substrate 100, a greater or fewer number of semiconductor chips may be mounted on the interposer substrate 100.

The first semiconductor chip 210 may include a first semiconductor substrate 211 and first chip pads 213, and the second semiconductor chip 220 may include a second semiconductor substrate 221 and second chip pads 223, and the third semiconductor chip 230 may include a third semiconductor substrate 231 and third chip pads 233. Each of the first to third semiconductor substrates 211, 221, and 231 may have an active surface facing the interposer substrate 100 and an inactive surface opposite to the active surface. The first to third semiconductor substrates 211, 221, and 231 may each include silicon, for example, crystalline silicon, polycrystalline silicon, or amorphous silicon. The first chip pads 213 may be on a lower surface of the first semiconductor chip 210, the second chip pads 223 may be on a lower surface of the second semiconductor chip 220, and the third chip pads 233 may be on a lower surface of the third semiconductor chip 230.

The first to third semiconductor chips 210, 220, and 230 may be mounted on the interposer substrate 100 in a flip-chip manner. Each of the first to third semiconductor chips 210, 220, and 230 may be mounted on the interposer substrate 100 through the connection bumps 260. The first semiconductor chip 210 may be electrically and physically connected to the interposer substrate 100 through the connection bumps 260 between the interposer substrate 100 and the first chip pads 213, the second semiconductor chip 220 may be electrically and physically connected to the interposer substrate 100 through the connection bumps 260 between the interposer substrate 100 and the second chip pads 223, and the third semiconductor chip 230 may be electrically and physically connected to the interposer substrate 100 through the connection bumps 260 between the interposer substrate 100 and the third chip pads 233.

The first to third semiconductor chips 210, 220, and 230 may be the same type of semiconductor chips or may be different types of semiconductor chips. In example embodiments, some of the first to third semiconductor chips 210, 220, and 230 may include memory chips, and the others may include logic chips. In example embodiments, the first semiconductor chip 210 may include a logic chip, and the second and third semiconductor chips 220 and 230 may each include a memory chip.

In example embodiments, the memory chip may include, for example, a volatile memory chip, such as a dynamic random access memory (DRAM) chip or a static random access memory (SRAM) chip or may include a non-volatile semiconductor chip, such as a phase-change random access memory (PRAM) chip, a magnetoresistive random access memory (MRAM) chip, a ferroelectric random access memory (FeRAM) chip, or a resistive random access memory (RRAM) chip. In example embodiments, at least one of the first to third semiconductor chips 210, 220, and 230 may include a plurality of vertically stacked high bandwidth memory (HBM) DRAM chips.

In example embodiments, the logic chip may include an artificial intelligence semiconductor, a microprocessor, a graphics processor, a signal processor, a network processor, a chipset, an audio codec, a video codec, or an application processor.

An underfill layer 241 may be between each of the first to third semiconductor chips 210, 220, and 230 and the interposer substrate 100. The underfill layer 241 may fill a gap between each of the first to third semiconductor chips 210, 220, and 230 and the interposer substrate 100 and surround sidewalls of the connection bumps 260. The underfill layer 241 may include an epoxy resin and an inorganic filler and/or an organic filler included in the epoxy resin. The underfill layer 241 may be formed through a capillary under-fill process.

The molding layer 250 may surround the first to third semiconductor chips 210, 220, and 230 over an upper surface of the interposer substrate 100. The molding layer 250 may cover the upper surface of the interposer substrate 100 and cover sidewalls of the first to third semiconductor chips 210, 220, and 230. In example embodiments, the molding layer 250 may cover the sidewalls of the first to third semiconductor chips 210, 220, and 230, and, in example embodiments, the molding layer 250 may not cover upper surfaces 219, 229, and 239 of the first to third semiconductor chips 210, 220, and 230. In example embodiments, an upper surface of the molding layer 250 may be coplanar with the upper surfaces 219, 229, and 239 of the first to third semiconductor chips 210, 220, and 230. For example, the molding layer 250 may include an epoxy resin and an inorganic filler and/or an organic filler included in the epoxy resin. In example embodiments, the molding layer 250 may include an epoxy mold compound (EMC). In some example embodiments, the underfill layer 241 may be omitted, and the molding layer 250 may further fill a gap between each of the first to third semiconductor chips 210, 220, and 230 and the interposer substrate 100 through a molded underfill process.

The heat dissipation member 400 may cover the upper surfaces 219, 229, and 239 of the first to third semiconductor chips 210, 220, and 230. The heat dissipation member 400 may include a heat dissipation plate, such as, for example, a heat slug or a heat sink. In example embodiments, the heat dissipation member 400 may include a flat plate or a three-dimensional shape made of a metal material. In example embodiments, the heat dissipation member 400 may include a top cover portion covering the upper surfaces 219, 229, and 239 of the first to third semiconductor chips 210, 220, and 230, and a side cover portion surrounding sidewalls of the first to third semiconductor chips 210, 220, and 230 and sidewalls of the interposer substrate 100. The side cover portion of the heat dissipation member 400 may extend from an edge of the top cover portion of the heat dissipation member 400 to an upper surface of the package substrate 510. A lower end of the side cover portion of the heat dissipation member 400 may be coupled to the package substrate 510.

In example embodiments, the heat dissipation member 400 may perform one or both of a heat dissipation function and an electromagnetic wave shielding function. The heat dissipation member 400 may be electrically and physically connected to an upper substrate pad 513 configured to provide a ground voltage among upper substrate pads 513 of the package substrate 510.

A thermal conductive adhesive layer 300 may be disposed between the upper surfaces 219, 229, and 239 of the first to third semiconductor chips 210, 220, and 230 and the heat dissipation member 400. The thermal conductive adhesive layer 300 may thermally and physically couple the first to third semiconductor chips 210, 220, and 230 to the heat dissipation member 400. The thermal conductive adhesive layer 300 may extend continuously along the upper surfaces 219, 229, and 239 of the first to third semiconductor chips 210, 220, and 230 and may completely cover the upper surfaces 219, 229, and 239 of the first to third semiconductor chips 210, 220, and 230 and the upper surface of the molding layer 250. The thermal conductive adhesive layer 300 may be in contact with a flat surface of the top cover portion of the heat dissipation member 400. The thermal conductive adhesive layer 300 may fill a gap between each of the upper surfaces 219, 229, and 239 of the first to third semiconductor chips 210, 220, and 230 and the heat dissipation member 400.

In example embodiments, the thermal conductive adhesive layer 300 may be electrically non-conductive.

In example embodiments, the upper surface of the molding layer 250 may be coplanar with the upper surfaces 219, 229, and 239 of the first to third semiconductor chips 210, 220, and 230, and a thickness (that is, a length in the vertical direction, for example, the Z direction) of the thermal conductive adhesive layer 300 may be uniform throughout the surface thereof.

The thermal conductive adhesive layer 300 may include a resin layer 310 including a curable resin and a heat dissipation filler included in the resin layer 310. The heat dissipation filler may be uniformly distributed in the resin layer 310. The heat dissipation filler may include an additive material for improving a thermal conductivity of the thermal conductive adhesive layer 300.

In example embodiments, the resin layer 310 may include a thermosetting resin. For example, the resin layer 310 may include a silicone resin, an acrylic resin, an epoxy resin, a polysiloxane resin, a phenoxy resin, a bismaleimide resin, unsaturated polyester, urethane, urea, phenol-formaldehyde, vulcanized rubber, a melamine resin, polyimide, an epoxy novolac resin, diglycidyl ether of bisphenol A (DGEBA), or cyanate ester, but is not limited thereto. In example embodiments, the resin layer 310 may also include a photocurable resin, such as an ultraviolet curable resin. For example, the resin layer 310 may include epoxy acrylate, urethane acrylate, an unsaturated polyester resin, polyester acrylate, polyether acrylate, or an unsaturated acrylic resin but is not limited thereto.

The thermal conductive adhesive layer 300 may include a first heat dissipation filler 320 including a liquid metal. For example, the first heat dissipation filler 320 may include gallium (Ga), a gallium alloy, indium (In), an indium alloy, tin (Sn), a tin alloy, mercury (Hg), a mercury alloy, or a combination thereof. In example embodiments, the thermal conductive adhesive layer 300 may include a gallium-indium alloy.

In example embodiments, the first heat dissipation filler 320 may be in a liquid state at a temperature that is less than or equal to 60° C., 50° C., 40° C., 30° C., 20° C., 10° C., 0° C., −10° C., 20° C., or −30° C.

In example embodiments, a volume fraction of the first heat dissipation filler 320, which is defined as a ratio of a volume of the first heat dissipation filler 320 to the total volume of the thermal conductive adhesive layer 300, may be in a range of from about 1% to about 90%, about 5% to about 85%, about 10% to about 80%, about 15% to about 80%, about 20% to about 75%, about 25% to about 70%, about 30% to about 65%, about 35% to about 60%, or about 40% to about 55%.

The thermal conductive adhesive layer 300 may include a second heat dissipation filler 330 including a material that is different from a material of the first heat dissipation filler 320. The second heat dissipation filler 330 may include a metal, a metal compound, ceramic, and/or a carbon-based material. The second heat dissipation filler 330 may include, for example, silver, a silver alloy, copper, a copper alloy, gold, a gold alloy, aluminum, an aluminum alloy, nickel, a nickel alloy, zinc, and/or a zinc alloy. For example, the second heat dissipation filler 330 may include silicon dioxide ($SiO_2$), aluminum oxide ($Al_2O_3$), aluminum nitride (AlN), zinc oxide (ZnO), magnesium oxide (MgO), boron nitride (BN), diamond, carbon nanotube (CNT), an NCT array, graphene, and/or a carbon-containing core-shell composite.

In example embodiments, a diameter of the second heat dissipation filler 330 may be in a range from about 0.1 μm to several hundred μm. For example, the diameter of the second heat dissipation filler 330 may be in a range from about 0.1 μm to 200 μm.

In example embodiments, the second heat dissipation filler 330 may include two or more types of heat dissipation fillers. Each type of heat dissipation filler may have different average particle diameters and/or different materials or material compositions. For example, the second heat dissipation filler 330 may include a first type of heat dissipation filler having a first average particle diameter, a second type of heat dissipation filler having a second average particle diameter, and a third type of heat dissipation filler having a third average particle diameter. The first average particle diameter, the second average particle diameter, and the third average particle diameter may be different from each other. Additionally, the first type of heat dissipation filler, the second type of heat dissipation filler, and the third type of heat dissipation filler may have different materials or different material compositions. Because the second heat dissipation filler 330 of an example embodiment includes two or more types of heat dissipation fillers having different average particle diameters, the packing density of the filler may be increased, and accordingly, the thermal conductive adhesive layer 300 may have a relatively low bond-line thickness while having relatively high thermal conductivity.

In example embodiments, the thermal conductivity of the thermal conductive adhesive layer 300 may be in a range from about 2 W/mK to about 100 W/mK, about 10 W/mK to about 90 W/mK, about 20 W/mK to about 80 W/mK, or about 30 W/mK to about 70 W/mK at room temperature.

In example embodiments, the elongation of the thermal conductive adhesive layer 300 may be in a range from about 5% to about 200%, about 10% to about 190%, about 20% to about 180%, about 30% to about 170%, about 40% to about 160%, about 50% to about 150%, 60% to about 140%, about a70% to about 130%, or about 80% to about 120% at room temperature.

The package substrate 510 may be below the interposer substrate 100. The package substrate 510 may be electrically and physically connected to the interposer substrate 100 through the board-interposer connection bumps 183. The package substrate 510 may include a substrate base 511, upper substrate pads 513 respectively arranged on upper and lower surfaces of the substrate base 511, and lower substrate pads 515. In example embodiments, the package substrate 510 may be a printed circuit board. For example, the package substrate 510 may be a multi-layer printed circuit board. The substrate base 511 may include at least one material selected from a phenol resin, an epoxy resin, and polyimide. The board-interposer connection bumps 183 may be respectively connected to the upper substrate pads 513, and external connection terminals 520 configured to electrically connect an external device to the semiconductor package 10 may be respectively connected to the lower substrate pads 515.

The semiconductor package 10 may further include a package underfill layer 530 between the interposer substrate 100 and the package substrate 510. The package underfill layer 530 may fill a gap between the interposer substrate 100 and the package substrate 510 and cover the board-interposer connection bumps 183. The package underfill layer 530 may be formed through, for example, a capillary underfill process.

Figure 2A:
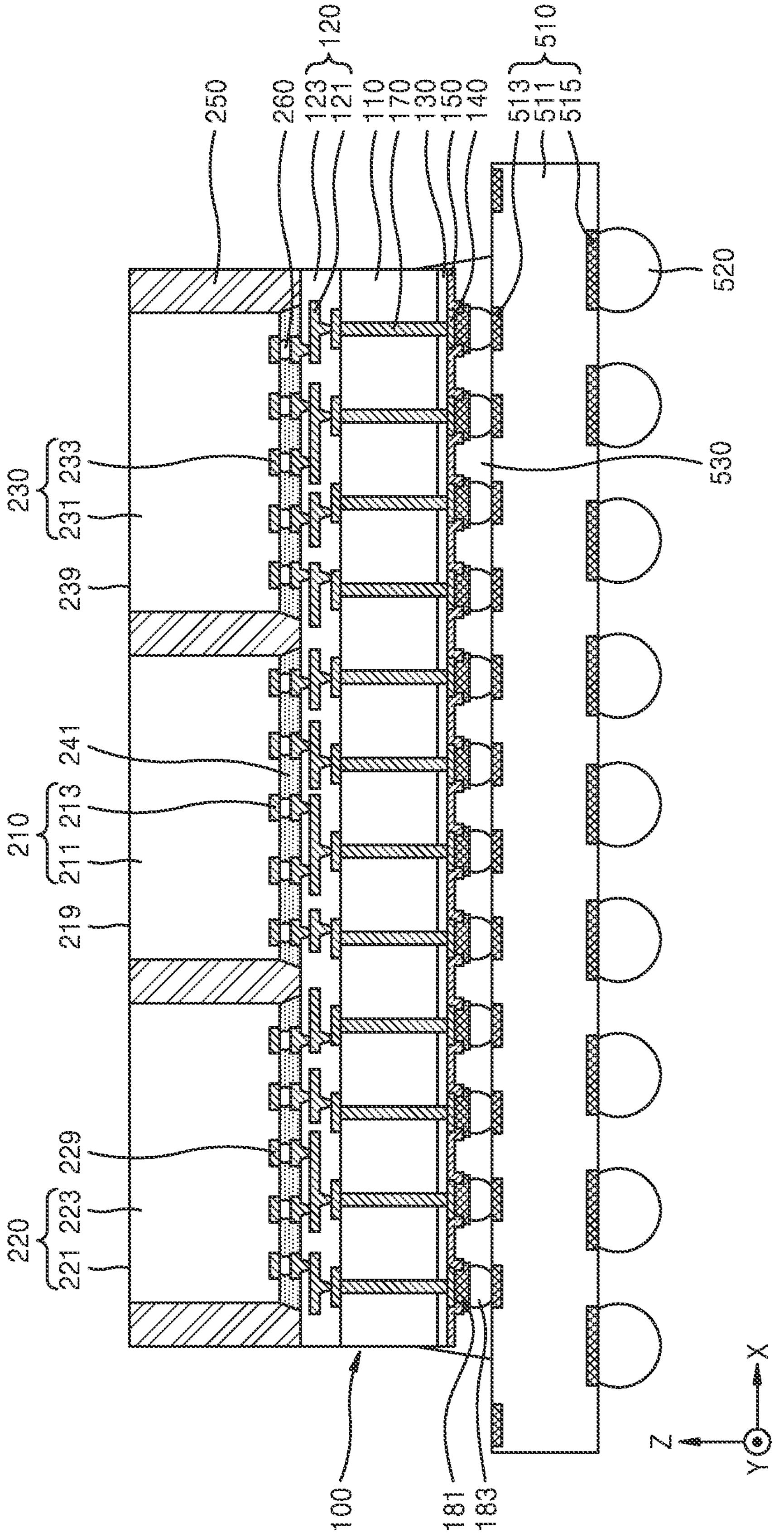
FIGS. 2A to 2C are cross-sectional views illustrating a method of manufacturing a semiconductor package, according to example embodiments.
Figure 2B:
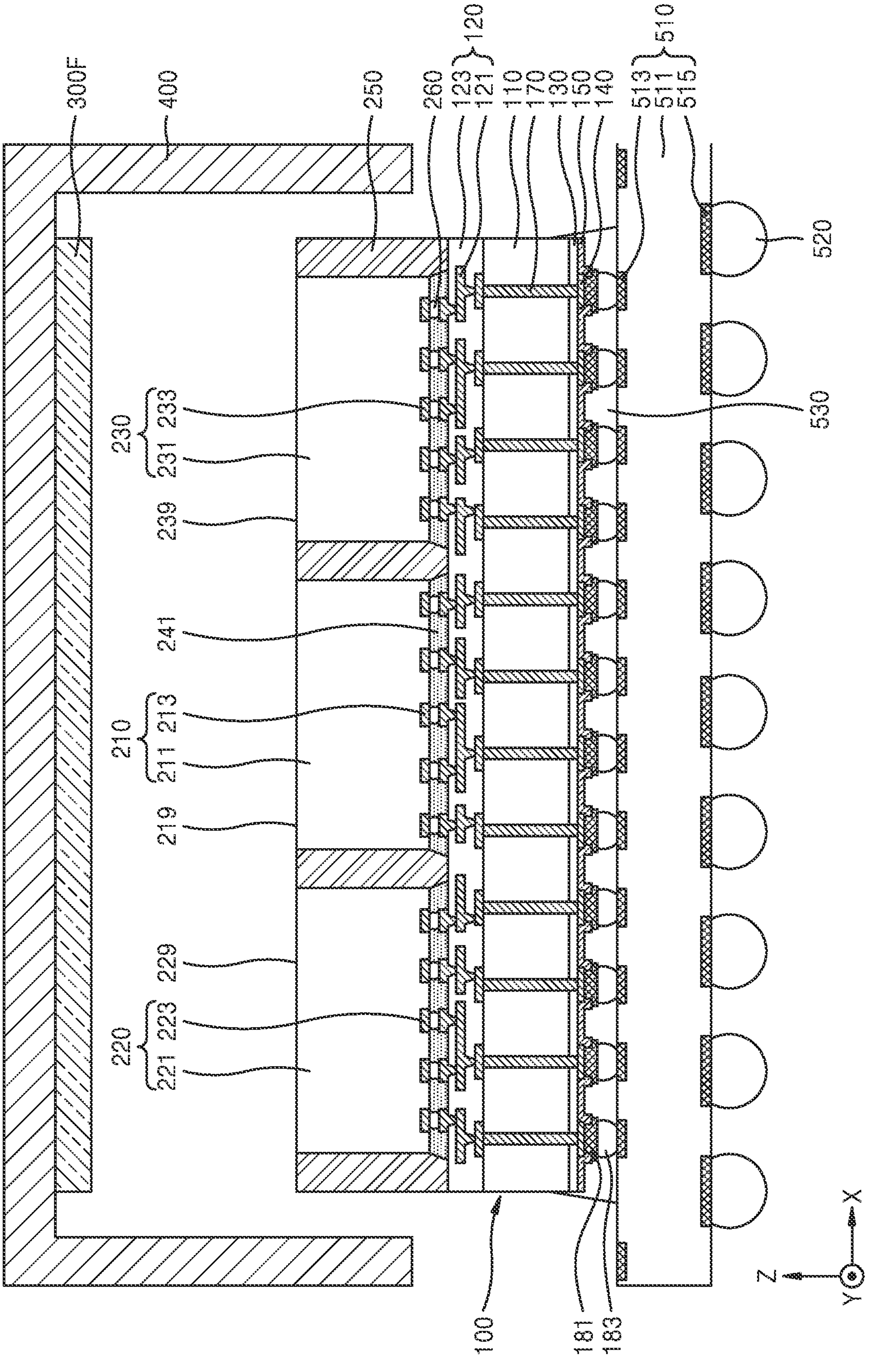
Figure 2C:
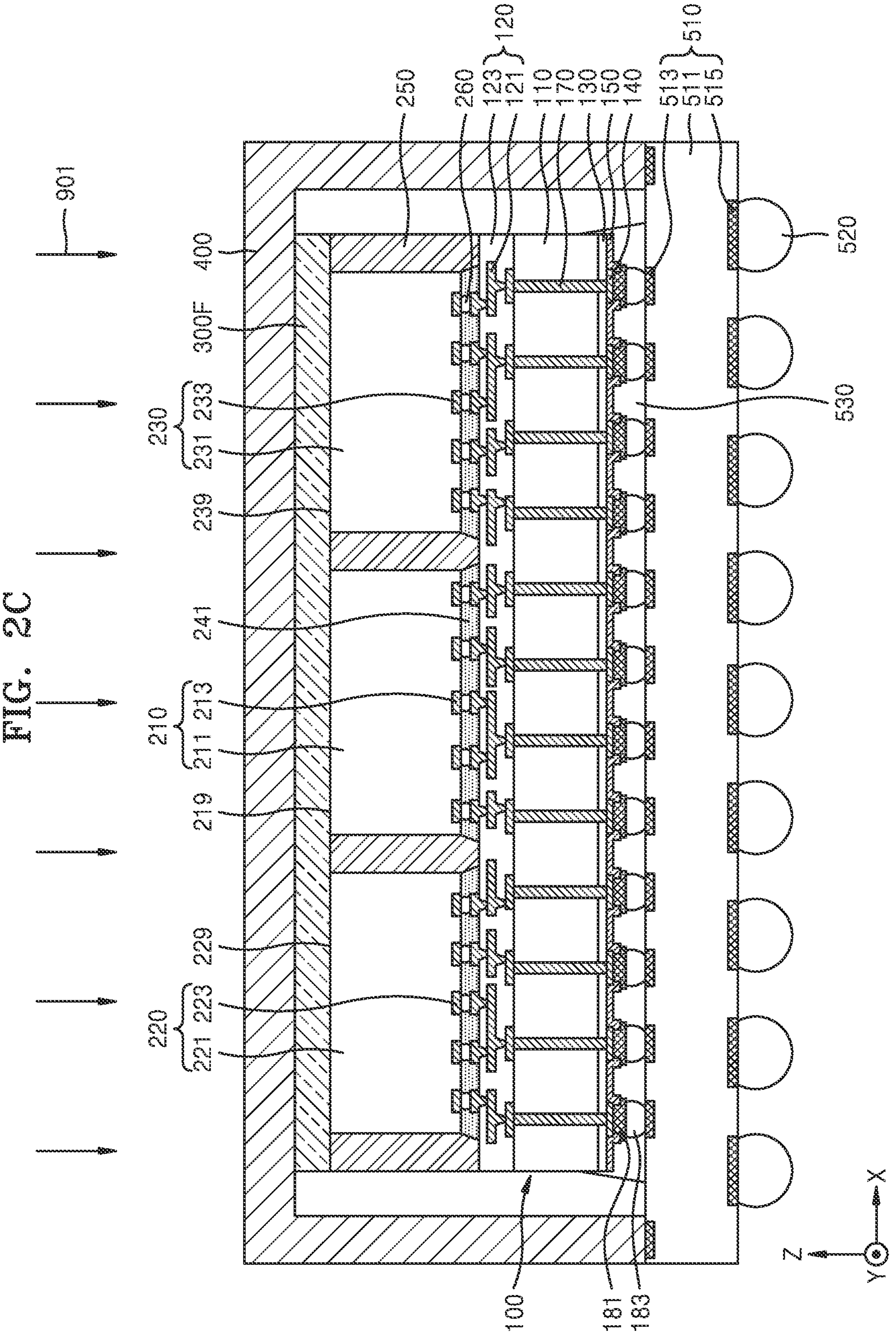

FIGS. 2A to 2C are cross-sectional views illustrating a method of manufacturing a semiconductor package, according to example embodiments. Hereinafter, a method of manufacturing the semiconductor package 10 illustrated in FIG. 1 will be described with reference to FIGS. 2A to 2C.

Referring to FIG. 2A, a structure including the interposer substrate 100, the first to third semiconductor chips 210, 220, and 230 mounted on the interposer substrate 100, and the molding layer 250 for molding the first to third semiconductor chips 210, 220, and 230 on the interposer substrate 100, is prepared. The structure may be mounted on the package substrate 510. The upper surfaces 219, 229, and 239 of the first to third semiconductor chips 210, 220, and 230 may be exposed to the outside.

Referring to FIG. 2B, a thermal interfacial material (TIM) film 300F is prepared, and the prepared TIM film 300F is attached to the heat dissipation member 400. The TIM film 300F may be a component for forming the thermal conductive adhesive layer 300 described with reference to FIG. 1. The thermal conductive adhesive layer 300 may be formed through a thermal compression process for the TIM film 300F.

The TIM film 300F may include a resin layer including a resin in a semi-cured state or a B-stage state, and a heat dissipation filler may be included in the resin layer. The resin layer of the TIM film 300F may include the same material as a material of the resin layer 310 of the thermal conductive adhesive layer 300. The heat dissipation filler included in the TIM film 300F may include the first heat dissipation filler 320 and the second heat dissipation filler 330 described above. The TIM film 300F may be manufactured as a film through a drop casting process using a resin mixed with a heat dissipation filler. The TIM film 300F may be formed by pre-curing a resin mixed with a heat dissipation filler at a first curing temperature to cause the resin to enter a semi-cured state so that the TIM film 300F includes a semi-cured resin. Since the TIM film 300F may include a semi-cured resin, the TIM film 300F may have relatively high fluidity and relatively high wettability.

In example embodiments, the viscosity of the TIM film 300F may be in a range from about 30 Pa·s to about 300 Pa·s, about 50 Pa·s to about 280 Pa·s, about 70 Pa·s to about 260 Pa·s, to about 90 Pa·s to about 240 Pa·s, about 110 Pa·s to about 220 Pa·s, or about 130 Pa·s to about 200 Pa·s at room temperature.

In example embodiments, the TIM film 300F may be electrically non-conductive.

Referring to FIG. 2C, the heat dissipation member 400 may be attached to the first to third semiconductor chips 210, 220, and 230. The TIM film 300F may be between the first to third semiconductor chips 210, 220, and 230 and the heat dissipation member 400. The heat dissipation member 400 may be temporarily fixed to the first to third semiconductor chips 210, 220, and 230 by the TIM film 300F. In addition, the heat dissipation member 400 may be bonded to the package substrate 510, and a conductive adhesive material, such as solder, may be provided between the heat dissipation member 400 and the package substrate 510 to couple the heat dissipation member 400 to the package substrate 510.

Referring to FIGS. 2C and 1, after the heat dissipation member 400 is temporarily fixed to the first to third semiconductor chips 210, 220, and 230 by the TIM film 300F, a thermal compression process may be performed for the TIM film 300F to cause a resin included in the TIM film 300F to change to a fully cured state. For example, the resin in the semi-cured state in the TIM film 300F may be changed from the semi-cured state into a fully cured state due to heat 901 provided from a curing source. The resin in the semi-cured state in the TIM film 300F may be treated at a second curing temperature to cause the resin to change to the fully cured state, and in this case, the second curing temperature may be higher than the first curing temperature described above. As the resin included in the TIM film 300F is in the fully cured state, the thermal conductive adhesive layer 300 may be formed from the TIM film 300F. The heat dissipation member 400 may be physically coupled to the first to third semiconductor chips 210, 220, and 230 by the thermal conductive adhesive layer 300 including the resin layer 310 in a fully cured state.

According to example embodiments, the TIM film 300F may be a soft material including a semi-cured resin and may have improved gap fill properties. The TIM film 300F may temporarily fix the heat dissipation member 400 to the first to third semiconductor chips 210, 220, and 230. In an example embodiment, since the TIM film 300F includes a semi-cured resin, the TIM film 300F may have relatively high fluidity and relatively high wettability. Accordingly, in an example embodiment, the TIM film 300F may have improved gap-filling properties and it is possible to prevent a void from being generated between each of the first to third semiconductor chips 210, 220, and 230 and the heat dissipation member 400. An example embodiment may accordingly further improve the reliability of thermal and physical coupling between each of the first to third semiconductor chips 210, 220, and 230 and the heat dissipation member 400. Additionally, once the TIM film 300F is temporarily fixes the heat dissipation member 400 to the first to third semiconductor chips 210, 220, and 230, a thermal compression process may be performed for the TIM film 300F to cause a resin included in the TIM film 300F to change to a fully cured state and thereby create the thermal conductive adhesive layer 300 from the TIM film 300F.

In addition, according to example embodiments, the thermal conductive adhesive layer 300 formed from the TIM film 300F has thermal conductivity properties that are improved by including a heat dissipation filler made of a liquid metal, and thus, the heat dissipation characteristics of the semiconductor package 10 using the heat dissipation member 400 and the thermal conductive adhesive layer 300 may be improved.

Figure 3:
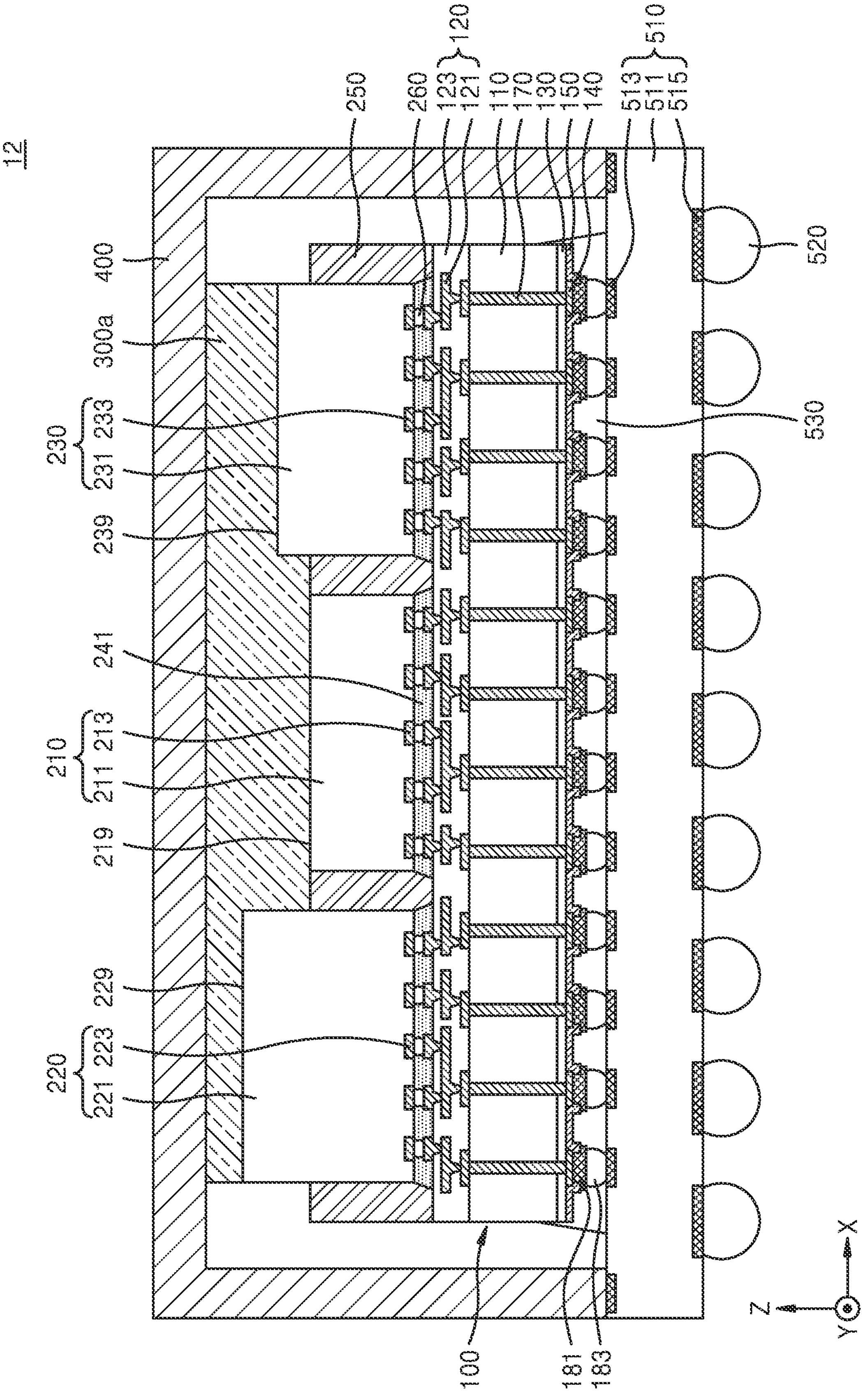
FIG. 3 is a cross-sectional view illustrating a semiconductor package according to an example embodiment.

FIG. 3 is a cross-sectional view illustrating a semiconductor package 12 according to an example embodiment. Hereinafter, the semiconductor package 12 illustrated in FIG. 3 will be mainly described with respect to differences from the semiconductor package 10 described with reference to FIG. 1.

Referring to FIG. 3, upper surfaces 219, 229, and 239 of first to third semiconductor chips 210, 220, and 230 in the semiconductor package 12 may be at different vertical levels. The vertical level of the upper surfaces 219, 229, and 239 is defined as a position of the upper surfaces 219, 229, and 239 of the first to third semiconductor chips 210, 220, 230 in the Z direction. For example, the upper surface 239 of the third semiconductor chip 230 may be at a higher vertical level than the upper surface 219 of the first semiconductor chip 210, and the upper surface 229 of the second semiconductor chip 220 may be at a higher vertical level than the upper surface 239 of the third semiconductor chip 230. In other words, a distance in the vertical direction (for example, the Z direction) between the upper surface 239 of the third semiconductor chip 230 and an interposer substrate 100 may be greater than a distance in the vertical direction (for example, the Z direction) between the upper surface 219 of the first semiconductor chip 210 and the interposer substrate 100, and a distance in the vertical direction (for example, the Z direction) between the upper surface 229 of the second semiconductor chip 220 and the interposer substrate 100 may be greater than the distance in the vertical direction (for example, the Z direction) between the upper surface 239 of the third semiconductor chip 230 and the interposer substrate 100. In the example embodiment, the first to third semiconductor chips 210, 220, 230 have bottom surfaces mounted at the same vertical level. Accordingly, the vertical levels of the upper surfaces 219, 229, and 239 of the first to third semiconductor chips 210, 220, 230 correspond to the height of the first to third semiconductor chips 210, 220, 230. That is, a height of the second semiconductor chip 220 is greater than a height of the first semiconductor chip 210 and the third semiconductor chip 230. Accordingly, the upper surface 239 of the third semiconductor chip 230 is at a higher vertical level than the upper surfaces 219 and 229 of the first semiconductor chip 210 and the second semiconductor chip 220.

A thermal conductive adhesive layer 300*a* may fill a gap between each of the upper surfaces 219, 229, and 239 of the first to third semiconductor chips 210, 220, and 230 and the heat dissipation member 400. The thermal conductive adhesive layer 300*a* may extend along a contour provided by the upper surfaces 219, 229, and 239 of the first to third semiconductor chips 210, 220, and 230 and an upper surface of the molding layer 250 to completely fill the gap between each of the upper surfaces 219, 229, and 239 of the first to third semiconductor chips 210, 220, and 230 and the heat dissipation member 400. The thermal conductive adhesive layer 300*a* may be in contact with a sidewall of at least one of the first to third semiconductor chips 210, 220, and 230.

A first portion of the thermal conductive adhesive layer 300*a* overlapped with the first semiconductor chip 210 may extend from the upper surface 219 of the first semiconductor chip 210 to the heat dissipation member 400 to completely fill the gap between the upper surface 219 of the first semiconductor chip 210 and the heat dissipation member 400, a second portion of the thermal conductive adhesive layer 300*a* overlapped with the second semiconductor chip 220 may extend from the upper surface 229 of the second semiconductor chip 220 to the heat dissipation member 400 to completely fill the gap between the upper surface 229 of the second semiconductor chip 220 and the heat dissipation member 400, and a third portion of the thermal conductive adhesive layer 300*a* overlapped with the third semiconductor chip 230 may extend from the upper surface 239 of the third semiconductor chip 230 to the heat dissipation member 400 to completely fill the gap between the upper surface 239 of the third semiconductor chip 230 and the heat dissipation member 400.

As shown in the example embodiment of FIG. 3, a thickness (that is, a length in a vertical direction (for example, the Z direction)) of the thermal conductive adhesive layer 300*a* may be different in different regions, for example, different regions associated with each of the first semiconductor chip 210, the second semiconductor chip 220 and the third semiconductor chip 230. The upper surface 219 of the first semiconductor chip 210 may be spaced apart from the heat dissipation member 400 by a first distance in a vertical direction (for example, the Z direction), the upper surface 239 of the third semiconductor chip 230 may be spaced apart from the heat dissipation member 400 by a third distance that is less than the first distance in the vertical direction (for example, in the Z direction), and the upper surface 229 of the second semiconductor chip 220 may be spaced apart from the heat dissipation member 400 by a second distance that is less than the third distance in the vertical direction (for example, the Z direction). In the example embodiment, the first portion of the thermal conductive adhesive layer 300*a* overlapped with the first semiconductor chip 210 may have a first thickness, and the third portion of the thermal conductive adhesive layer 300*a* overlapped with the third semiconductor chip 230 may have a third thickness that is less than the first thickness, and the second portion of the thermal conductive adhesive layer 300*a* overlapped with the second semiconductor chip 220 may have a second thickness that is less than the third thickness.

As described above, the thermal conductive adhesive layer 300*a* may be formed from the TIM film 300F of FIG. 2C which includes a resin layer in a semi-cured state. Because the TIM film 300F is a flexible material and has improved gap-fill properties, even when the upper surfaces 219, 229, and 239 of the first to third semiconductor chips 210, 220, and 230 each have a step difference, the TIM film 300F may flow and may be deformed during a thermal compression process to completely fill a gap between each of the first to third semiconductor chips 210, 220, and 230 and the heat dissipation member 400.

Figure 4:
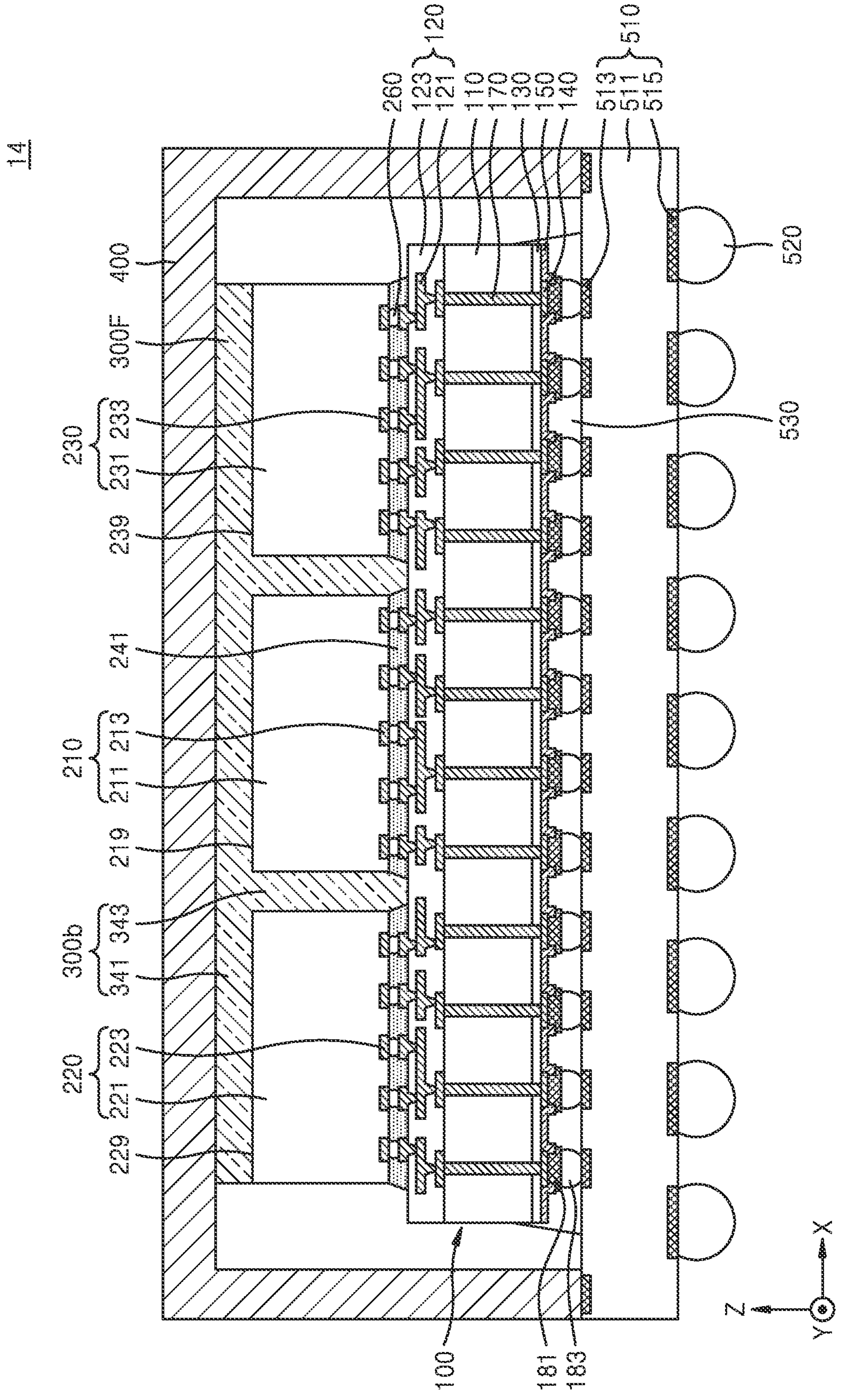
FIG. 4 is a cross-sectional view illustrating a semiconductor package according to an example embodiment.

FIG. 4 is a cross-sectional view illustrating a semiconductor package 14 according to an example embodiment.

Hereinafter, the semiconductor package 14 illustrated in FIG. 4 will be mainly described with respect to differences from the semiconductor package 10 described with reference to FIG. 1.

Referring to FIG. 4, a thermal conductive adhesive layer 300*b* in the semiconductor package 14 may cover upper surfaces 219, 229, and 239 of first to third semiconductor chips 210, 220, and 230 and may also at least partially fill gaps between sidewalls of the first to third semiconductor chips 210, 220, and 230. In example embodiments, the thermal conductive adhesive layer 300*b* may include a top fill portion 341 extending along the upper surfaces 219, 229, and 239 of the first to third semiconductor chips 210, 220, and 230, and side fill portions 343 that at least partially fill gaps between sidewalls of the first to third semiconductor chips 210, 220, and 230. The side fill portions 343 may extend along a sidewall of the first semiconductor chip 210, a sidewall of the second semiconductor chip 220, and/or a sidewall of the third semiconductor chip 230.

As described above, the thermal conductive adhesive layer 300*b* may be formed from the TIM film 300F of FIG. 2C which includes a resin layer in a semi-cured state. Because the TIM film 300F is a flexible material and has improved gap-fill properties, the TIM film 300F may flow and may be deformed during a thermal compression process to at least partially fill gaps between sidewalls of the first to third semiconductor chips 210, 220, and 230.

Figure 5:
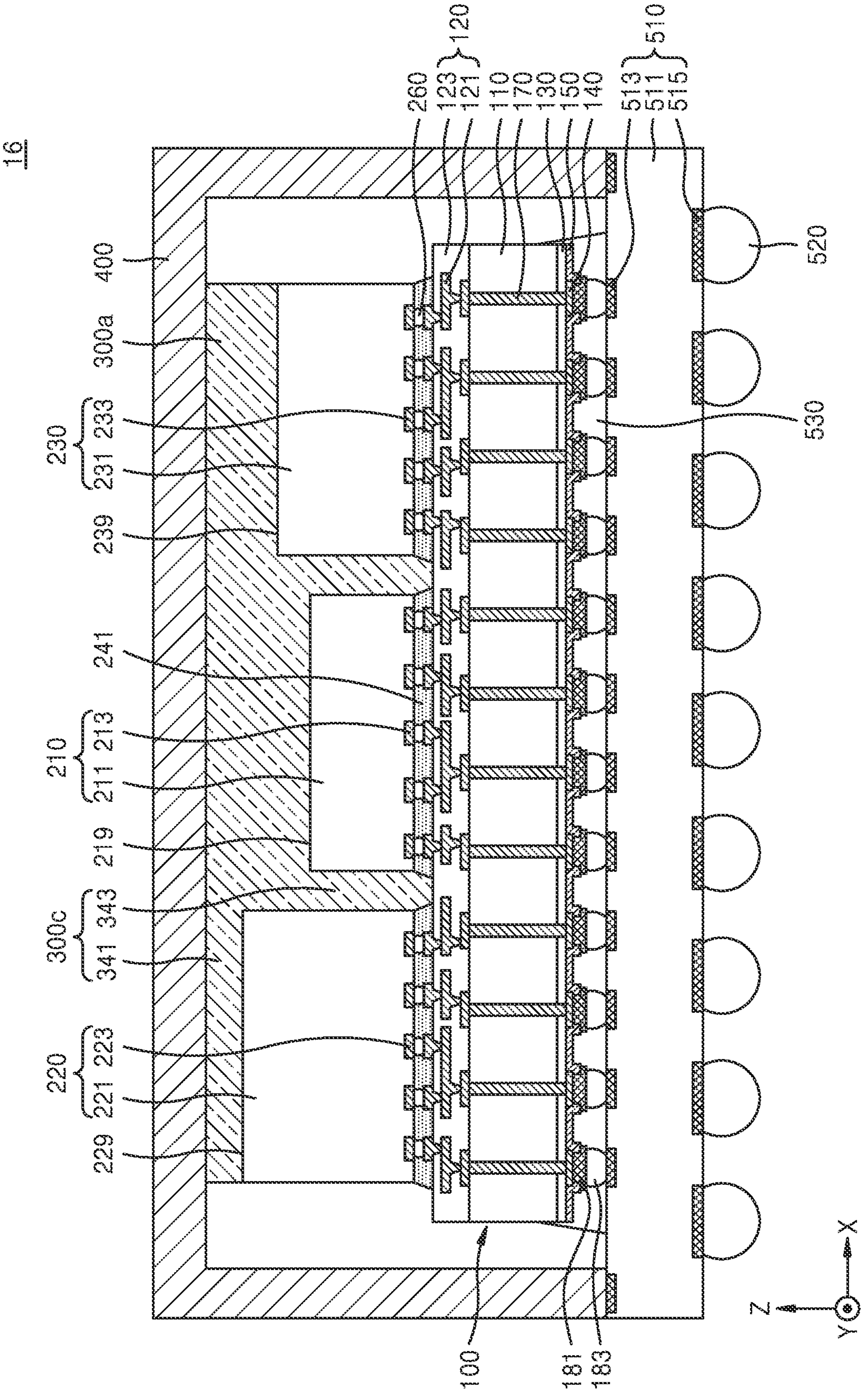
FIG. 5 is a cross-sectional view illustrating a semiconductor package according to an example embodiment.

FIG. 5 is a cross-sectional view illustrating a semiconductor package 16 according to an example embodiment. Hereinafter, the semiconductor package 16 illustrated in FIG. 5 will be mainly described with respect to differences from the semiconductor package 14 described with reference to FIG. 4.

Referring to FIG. 5, upper surfaces 219, 229, and 239 of first to third semiconductor chips 210, 220, and 230 in the semiconductor package 16 may be at different vertical levels, and distances between the upper surfaces 219, 229, and 239 of the first to third semiconductor chips 210, 220, and 230 and the heat dissipation member 400 may be different from each other. A thermal conductive adhesive layer 300*c* may fill gaps between the upper surfaces 219, 229, and 239 of the first to third semiconductor chips 210, 220, and 230 and the heat dissipation member 400 and may also at least partially fill gaps between sidewalls of the first to third semiconductor chips 210, 220, and 230. In example embodiments, the thermal conductive adhesive layer 300*c* may include a top fill portion 341 extending along the upper surfaces 219, 229, and 239 of the first to third semiconductor chips 210, 220, and 230, and side fill portions 343 that at least partially fill gaps between the sidewalls of the first to third semiconductor chips 210, 220, and 230. The thermal conductive adhesive layer 300*c* may be formed from the TIM film 300F of FIG. 2C, which includes a resin layer in a semi-cured state.

Figure 6:
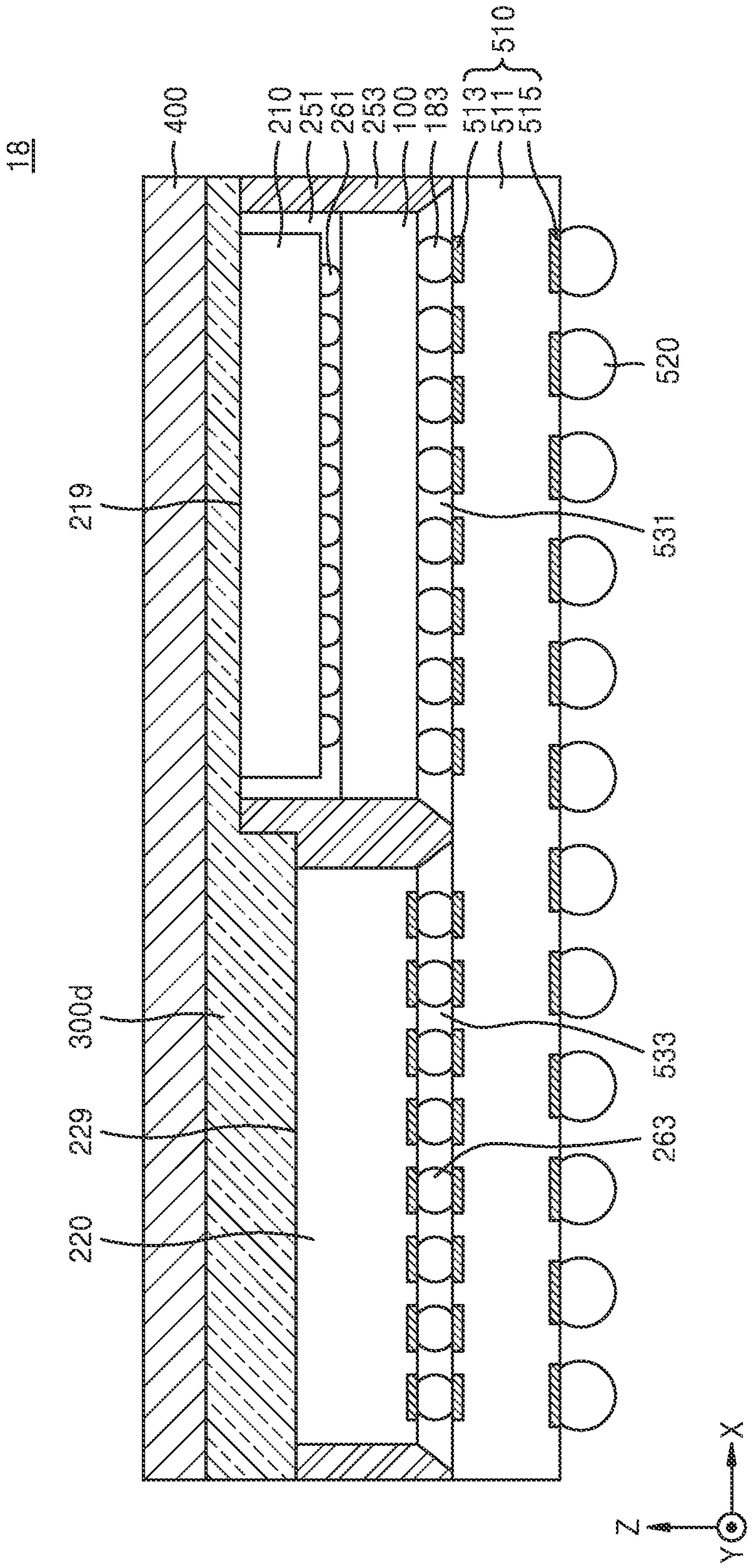
FIG. 6 is a cross-sectional view illustrating a semiconductor package according to an example embodiment.

FIG. 6 is a cross-sectional view illustrating a semiconductor package 18 according to an example embodiment. Hereinafter, the semiconductor package 18 illustrated in FIG. 6 will be mainly described with respect to differences from the semiconductor package 10 described with reference to FIG. 1.

Referring to FIG. 6, a second semiconductor chip 220 and an interposer substrate 100 in the semiconductor package 18 may be mounted on a package substrate 510, and a first semiconductor chip 210 may be mounted on the interposer substrate 100. The second semiconductor chip 220 may be laterally spaced apart from the interposer substrate 100 on the package substrate 510. The second semiconductor chip 220 may be physically and electrically connected to the package substrate 510 through connection bumps 263, and an underfill layer 533 surrounding the connection bumps 263 may be disposed between the second semiconductor chip 220 and the package substrate 510. The interposer substrate 100 may be physically and electrically connected to the package substrate 510 through board-interposer connection bumps 183, and an underfill layer 531 surrounding the board-interposer connection bumps 183 may be between the interposer substrate 100 and the package substrate 510. The first semiconductor chip 210 may be physically and electrically connected to the interposer substrate 100 through the connection bumps 261. A sub-molding layer 251 may be on the interposer substrate 100 to surround sidewalls of the first semiconductor chip 210 and fill a gap between the first semiconductor chip 210 and the interposer substrate 100. For example, the sub-molding layer 251 may be formed of an epoxy mold compound (EMC).

The semiconductor package 18 may include a molding layer 253 that at least partially covers each of the first semiconductor chip 210, the second semiconductor chip 220, and the interposer substrate 100 on the package substrate 510. The molding layer 250 may surround sidewalls of the first semiconductor chip 210 and sidewalls of the second semiconductor chip 220 but, in an example embodiment, may not cover an upper surface 219 of the first semiconductor chip 210 and an upper surface 229 of the second semiconductor chip 220. For example, the molding layer 253 may be formed of an EMC.

A thermal conductive adhesive layer 300*d* may be between the heat dissipation member 400 and the upper surfaces 219 and 229 of the first and second semiconductor chips 210 and 220 and may thermally and physically couple the first and second semiconductor chips 210 and 220 to the heat dissipation member 400. The thermal conductive adhesive layer 300*d* may extend along a contour provided by the upper surfaces 219 and 229 of the first and second semiconductor chips 210 and 220 and an upper surface of the molding layer 250 and may completely fill gaps between the heat dissipation member 400 and the upper surfaces 219 and 229 of the first and second semiconductor chips 210 and 220.

In example embodiments, the upper surfaces 219 and 229 of the first and second semiconductor chips 210 and 220 may be at different vertical levels, and distances between the upper surfaces 219 and 229 of the first and second semiconductor chips 210 and 220 and the heat dissipation member 400 may be different from each other. For example, a distance in a vertical direction (for example, the Z direction) between the upper surface 219 of the first semiconductor chip 210 and the heat dissipation member 400 may be less than a distance in a vertical direction (for example, the Z direction) between the upper surface 229 of the second semiconductor chip 220 and the heat dissipation member 400. In this case, a first portion of the thermal conductive adhesive layer 300*d* overlapped with the first semiconductor chip 210 may have a first thickness, and a second portion of the thermal conductive adhesive layer 300*d* overlapped with the second semiconductor chip 220 may have a second thickness that is greater than the first thickness.

As described above, the thermal conductive adhesive layer 300*d* may be formed from the TIM film 300F of FIG. 2C, which includes a resin layer in a semi-cured state. Because the TIM film 300F is a flexible material and has improved gap-fill properties, the TIM film 300F may flow and may be deformed during a thermal compression process to completely fill gaps between the first and second semiconductor chips 210 and 220 and the heat dissipation member 400.

Figure 7:
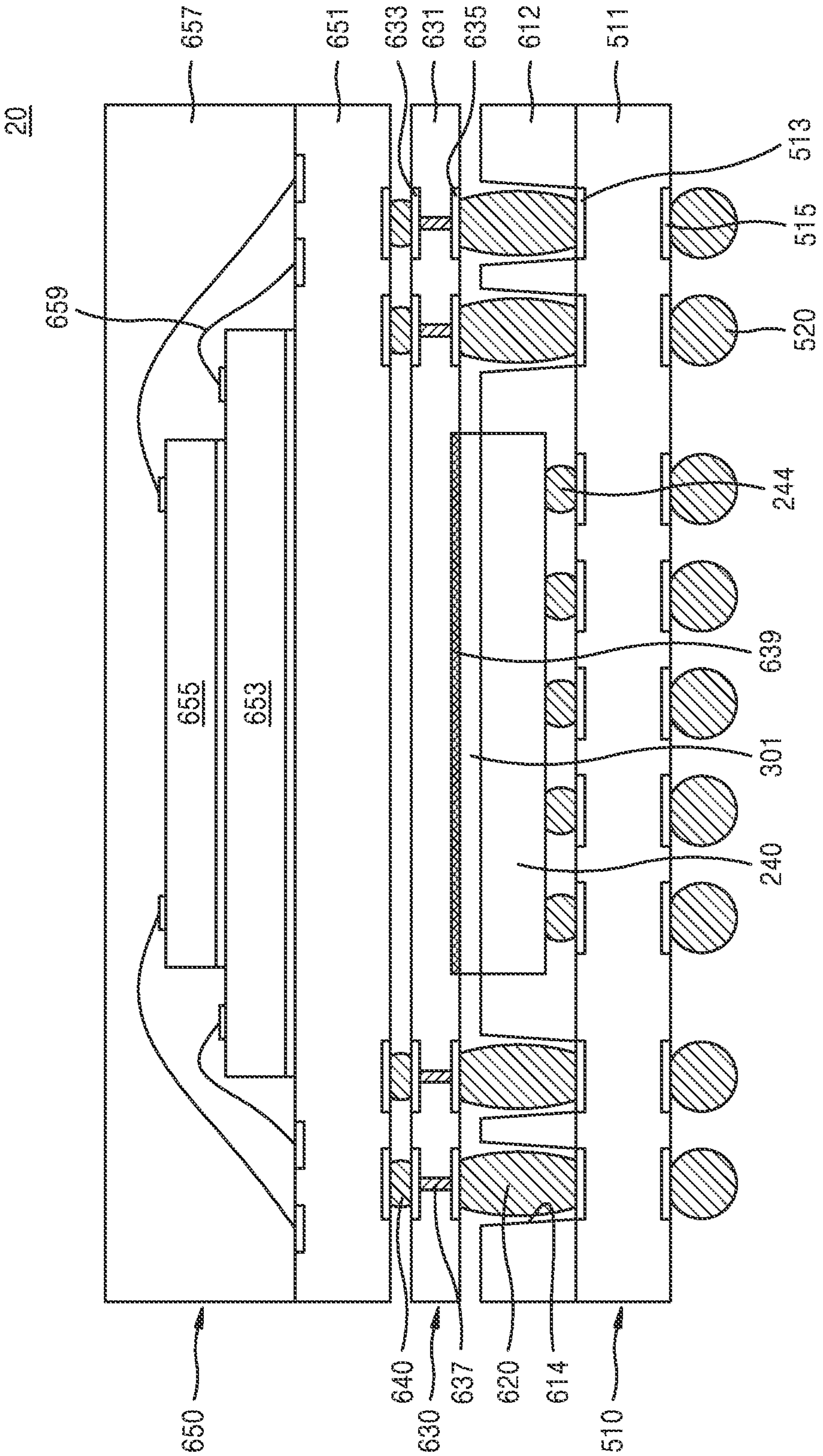
FIG. 7 is a cross-sectional view illustrating a semiconductor package according to an example embodiment.

FIG. 7 is a cross-sectional view illustrating a semiconductor package 20 according to an example embodiment. Hereinafter, descriptions that overlap with the above descriptions are omitted or simplified.

Referring to FIG. 7, a lower semiconductor chip 240 may be mounted on the package substrate 510 through connection bumps 244, an interposer substrate 630 may be on the lower semiconductor chip 240, and an upper package 650 may be on the interposer substrate 630.

The interposer substrate 630 may include a base insulating layer 631, upper pads 633 provided on an upper surface of the base insulating layer 631, lower pads 635 provided on a lower surface of the base insulating layer 631, and conductive via patterns 637 passing through the base insulating layer 631 to electrically connect the upper pads 633 to the lower pads 635. The interposer substrate 630 may include, for example, a printed circuit board.

A lower molding layer 612 having connection holes 614 exposing upper substrate pads 513 may be provided on the package substrate 510. Inter-substrate connection terminals 620 may be in the connection holes 614 of the lower molding layer 612. The inter-substrate connection terminals 620 may extend from the upper substrate pads 513 of the package substrate 510 to the lower pads 635 of the interposer substrate 630. The lower molding layer 612 may cover sidewalls of the lower semiconductor chip 240 and expose an upper surface of the lower semiconductor chip 240. That is, in an example embodiment, the lower molding layer 612 may not cover the upper surface of the lower semiconductor chip 240.

The upper package 650 may be mounted on the interposer substrate 630 through package-to-package connection terminals 640. The upper package 650 may include a substrate 651, upper semiconductor chips 653 and 655 mounted on the substrate 651, an upper molding layer 657 covering the upper semiconductor chips 653 and 655 on the substrate 651, and conductive wires 659 electrically connecting the upper semiconductor chips 653 and 655 to the substrate 651.

A semiconductor package 20 may include a thermal conductive adhesive layer 301 between the interposer substrate 630 and the upper surface 219 of the lower semiconductor chip 240. The thermal conductive adhesive layer 301 may be formed by using the TIM film 300F of FIG. 2C. The thermal conductive adhesive layer 301 may be in contact with the upper surface 219 of the lower semiconductor chip 240 and a lower surface of the interposer substrate 630. In example embodiments, the interposer substrate 630 may include a heat-dissipating conductive layer 639 in contact with the thermal conductive adhesive layer 301. The heat-dissipation conductive layer 639 may be referred to as a heat dissipation member. The heat-dissipation conductive layer 639 may be thermally coupled to the lower semiconductor chip 240 through the thermal conductive adhesive layer 301. Heat generated from the lower semiconductor chip 240 may be dissipated through the thermal conductive adhesive layer 301 and the heat-dissipation conductive layer 639 of the interposer substrate 630.

While aspects of example embodiments have been particularly shown and described, it will be understood that various changes in form and details may be made therein without departing from the spirit and scope of the following claims.

What is claimed is:

1. A semiconductor package comprising:

a first semiconductor chip and a second semiconductor chip on a first substrate;

a thermal conductive adhesive layer on the first semiconductor chip and the second semiconductor chip and comprising a resin layer, the resin layer comprising a first heat dissipation filler, the first heat dissipation filler comprising a metal in a liquid state at or below 60° C.; and a heat dissipation member on the thermal conductive adhesive layer wherein the thermal conductive adhesive layer further comprises a second heat dissipation filler comprising a material that is different from a material of the first heat dissipation filler, and wherein the second heat dissipation filler comprises a plurality of heat dissipation fillers having different diameters.

2. The semiconductor package of claim 1, wherein the resin layer comprises at least one of a silicone resin, an acrylic resin, and an epoxy resin.

3. The semiconductor package of claim 1, wherein the first heat dissipation filler comprises gallium.

4. The semiconductor package of claim 1, wherein the second heat dissipation filler comprises a metal.

5. The semiconductor package of claim 1, wherein the second heat dissipation filler comprises a ceramic.

6. The semiconductor package of claim 1, wherein the second heat dissipation filler comprises at least one of diamond, a carbon nanotube, a carbon nanotube array, and graphene.

7. The semiconductor package of claim 1, wherein an upper surface of the first semiconductor chip is spaced apart from the heat dissipation member by a first distance, wherein an upper surface of the second semiconductor chip is spaced apart from the heat dissipation member by a second distance that is less than the first distance, wherein the thermal conductive adhesive layer has a first thickness between the upper surface of the first semiconductor chip and the heat dissipation member, and a second thickness between the upper surface of the second semiconductor chip and the heat dissipation member, and wherein the second thickness is smaller than the first thickness.

8. The semiconductor package of claim 7, further comprising a molding layer contacting a sidewall of the first semiconductor chip and a sidewall of the second semiconductor chip, wherein the thermal conductive adhesive layer extends along the upper surface of the first semiconductor chip, the upper surface of the second semiconductor chip, and an upper surface of the molding layer.

9. The semiconductor package of claim 7, wherein the thermal conductive adhesive layer fills a first gap between the upper surface of the first semiconductor chip and the heat dissipation member and a second gap between the upper surface of the second semiconductor chip and the heat dissipation member.

10. The semiconductor package of claim 1, wherein the thermal conductive adhesive layer contacts an upper surface of the first semiconductor chip and an upper surface of the second semiconductor chip, and wherein at least a part of the thermal conductive adhesive layer is between a sidewall of the first semiconductor chip and a sidewall of the second semiconductor chip.

11. The semiconductor package of claim 1, wherein the thermal conductive adhesive layer is electrically non-conductive.

12. The semiconductor package of claim 1, wherein a thermal conductivity of the thermal conductive adhesive layer is in a range of about 2 W/mK to about 100 W/mK, and wherein an elongation of the thermal conductive adhesive layer is in a range of about 5% to about 200%.

13. A semiconductor package comprising:

a package substrate;

an interposer substrate on the package substrate;

a first semiconductor chip on the interposer substrate;

a second semiconductor chip on the interposer substrate and laterally spaced apart from the first semiconductor chip;

a molding layer contacting a sidewall of the first semiconductor chip and a sidewall of the second semiconductor chip;

a thermal conductive adhesive layer on the first semiconductor chip and the second semiconductor chip and comprising a resin layer, the resin layer comprising a first heat dissipation filler, the first heat dissipation filler comprising a metal in a liquid state at or below 60° C.; and a heat dissipation member on the thermal conductive adhesive layer, wherein an upper surface of the first semiconductor chip is at a different level than an upper surface of the second semiconductor chip, wherein the thermal conductive adhesive layer extends along the upper surface of the first semiconductor chip, the upper surface of the second semiconductor chip, and an upper surface of the molding layer, wherein the thermal conductive adhesive layer extends from each of the upper surface of the first semiconductor chip and the upper surface of the second semiconductor chip to the heat dissipation member, wherein a thermal conductivity of the thermal conductive adhesive layer is in a range of about 2 W/mK to about 100 W/mK, wherein an elongation of the thermal conductive adhesive layer is in a range of about 5% to about 200%, wherein the upper surface of the first semiconductor chip is spaced apart from the heat dissipation member by a first distance, wherein the upper surface of the second semiconductor chip is spaced apart from the heat dissipation member by a second distance that is less than the first distance, wherein the thermal conductive adhesive layer has a first thickness between the upper surface of the first semiconductor chip and the heat dissipation member, and a second thickness between the upper surface of the second semiconductor chip and the heat dissipation member, and wherein the second thickness is smaller than the first thickness.

* * * * *